United States Patent
Hsiao et al.

(10) Patent No.: US 9,461,133 B1
(45) Date of Patent: Oct. 4, 2016

(54) HIGH VOLTAGE METAL-OXIDE-SEMICONDUCTOR TRANSISTOR DEVICE HAVING STEPPED GATE STRUCTURE AND MANUFACTURING METHOD THEREOF

(71) Applicant: UNITED MICROELECTRONICS CORP., Hsin-Chu (TW)

(72) Inventors: Shih-Yin Hsiao, Chiayi County (TW); Kun-Huang Yu, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/748,255

(22) Filed: Jun. 24, 2015

(30) Foreign Application Priority Data

Jun. 2, 2015 (CN) .......................... 2015 1 0294231

(51) Int. Cl.
| | |
|---|---|
| *H01L 29/78* | (2006.01) |
| *H01L 21/336* | (2006.01) |
| *H01L 29/423* | (2006.01) |
| *H01L 29/66* | (2006.01) |
| *H01L 21/266* | (2006.01) |
| *H01L 29/10* | (2006.01) |

(52) U.S. Cl.
CPC ......... *H01L 29/4238* (2013.01); *H01L 21/266* (2013.01); *H01L 29/1095* (2013.01); *H01L 29/66689* (2013.01); *H01L 29/66704* (2013.01); *H01L 29/7816* (2013.01)

(58) Field of Classification Search
CPC ................ H01L 21/823418; H01L 21/82385; H01L 21/32133; H01L 21/823814; H01L 21/823892; H01L 21/26586; H01L 21/823807; H01L 27/0928; H01L 29/7836; H01L 29/66575; H01L 29/7833; H01L 29/66537; H01L 29/4238; H01L 29/7816; H01L 29/1095; H01L 29/66689; H01L 29/66704
USPC ................... 257/124, 337; 438/237, 275, 287
See application file for complete search history.

(56) References Cited

U.S. PATENT DOCUMENTS

| | | | | |
|---|---|---|---|---|
| 2010/0244965 | A1* | 9/2010 | Shima ................. | H01L 29/0634 330/277 |
| 2010/0252882 | A1* | 10/2010 | Denison .............. | H01L 29/0865 257/337 |
| 2014/0320174 | A1* | 10/2014 | Lu ........................ | H01L 29/7816 327/109 |
| 2015/0187938 | A1* | 7/2015 | Tang ................... | H01L 29/7836 257/369 |

* cited by examiner

*Primary Examiner* — Thomas L Dickey
*Assistant Examiner* — Changhyun Yi
(74) *Attorney, Agent, or Firm* — Winston Hsu; Scott Margo

(57) ABSTRACT

A high voltage metal-oxide-semiconductor transistor device having stepped gate structure and a manufacturing method thereof are provided. The manufacturing method includes following steps. A gate structure is formed on a semiconductor substrate. The semiconductor substrate includes a first region and a second region disposed on a side of a first part of the gate structure and a side of a second part of the gate structure respectively. A patterned mask layer is formed on the semiconductor substrate and the gate structure. The patterned mask layer covers the first region and the first part. The second part is uncovered by the patterned mask layer. An implantation process is performed to form a drift region in the second region. An etching process is performed to remove a part of the second part uncovered by the patterned mask layer. A thickness of the second part is less than that of the first part after the etching process.

9 Claims, 4 Drawing Sheets

HIGH VOLTAGE METAL-OXIDE-SEMICONDUCTOR TRANSISTOR DEVICE HAVING STEPPED GATE STRUCTURE AND MANUFACTURING METHOD THEREOF

BACKGROUND OF THE INVENTION

1. Field of the Invention

The present invention relates to a high-voltage metal-oxide-semiconductor (HV MOS) transistor device and manufacturing method thereof, and more particularly, to a HV MOS transistor device for reducing parasitic capacitance and a manufacturing method thereof.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency (HF) band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. In a drain extending MOS (DEMOS) transistor, the drift region is disposed between the gate and the drain, and the parasitic capacitance between gate and drain will affect the operation of the device. For example, when the DEMOS transistor is used as a power amplifier, the power added efficiency (PAE) will be lowered by larger gate-to-drain parasitic capacitance (Cgd), and the Cgd has to be reduced by modifying structural designs.

SUMMARY OF THE INVENTION

It is one of the objectives of the present invention to provide a high-voltage metal-oxide-semiconductor (HV MOS) transistor device and manufacturing method thereof. A part of a gate structure adjacent to a drift region is partially removed by an etching process for reducing gate-to-drain parasitic capacitance.

A manufacturing method of a high-voltage metal-oxide-semiconductor (HV MOS) transistor device is provided in an embodiment of the present invention. The manufacturing method includes the following steps. A semiconductor substrate is provided. A gate structure is formed on the semiconductor substrate. The gate structure includes a first part and a second part. The semiconductor substrate has a first region and a second region, the first region is disposed on a side of the first part of the gate structure, and the second region is disposed on a side of the second part of the gate structure. A patterned mask layer is then formed on the semiconductor substrate and the gate structure. The patterned mask layer covers the first region of the semiconductor substrate and the first part of the gate structure, and the second part of the gate structure is uncovered by the patterned mask layer. An implantation process is performed to form a drift region in the second region. An etching process is performed to remove a part of the second part of the gate structure uncovered by the patterned mask layer. A thickness of the second part is less than a thickness of the first part after the etching process.

A high-voltage metal-oxide-semiconductor (HV MOS) transistor device is provided in an embodiment of the present invention. The HV MOS transistor device includes a semiconductor substrate, a gate structure, and a drift region. The gate structure is disposed on the semiconductor substrate. The gate structure includes a first part and a second part, and a thickness of the second part is less than a thickness of the first part. The drift region is disposed on a side of the second part of the gate structure.

In the manufacturing method of the HV MOS transistor device in the present invention, the portion of the gate structure adjacent to the drift region may become relatively thinner, and the gate-to-drain parasitic capacitance may be reduced nearly without influencing other device characteristics of the transistor device accordingly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
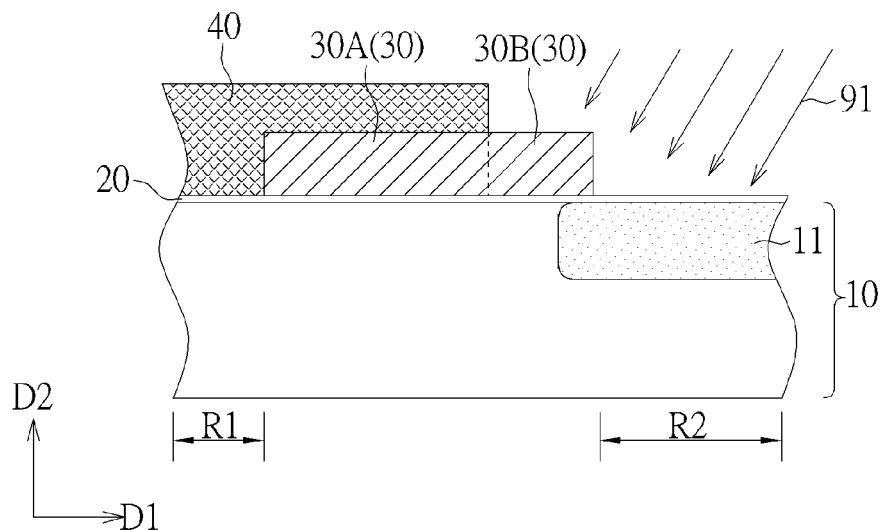
FIG. 1 and FIG. 2 are schematic drawings illustrating a manufacturing method of a high-voltage metal-oxide-semiconductor transistor device according to a first embodiment of the present invention.
Figure 2:
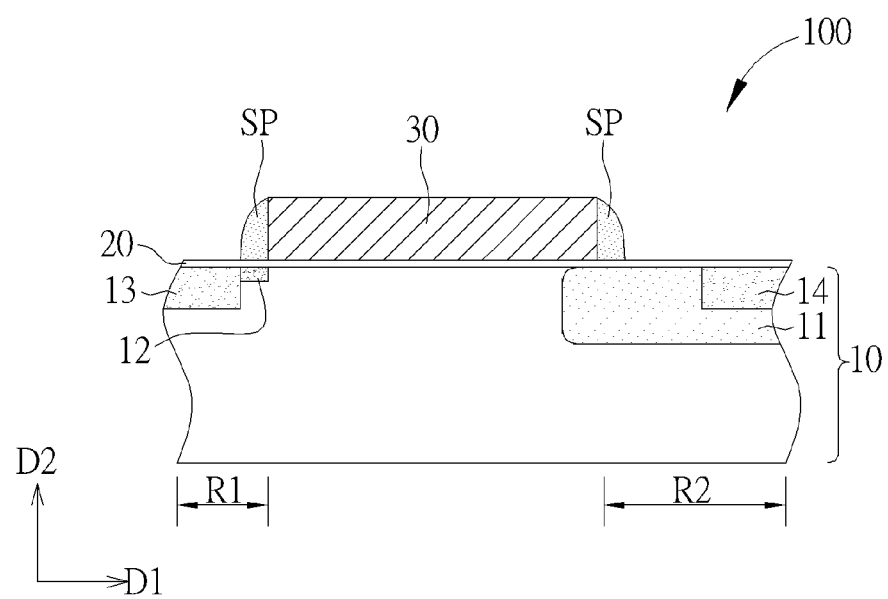

Please refer to FIG. 1 and FIG. 2. FIG. 1 and FIG. 2 are schematic drawings illustrating a manufacturing method of a high-voltage metal-oxide-semiconductor (HV MOS) transistor device according to a first embodiment of the present invention. The manufacturing method of the HV MOS transistor device in this embodiment includes the following steps. As shown in FIG. 1, a semiconductor substrate 10 is provided, and a gate structure 30 is formed on the semiconductor substrate 10. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The gate structure 30 in this embodiment may include a polycrystalline silicon gate, a metal gate, or gate structures made of other appropriate materials. Additionally, a gate insulation layer 20 may be formed on the semiconductor substrate 10 and at least partially disposed between the gate structure 30 and the semiconductor substrate 10. The gate structure 30 includes a first part 30A and a second part 30B. The semiconductor substrate 10 has a first region R1 and a second region R2, the first region R1 is disposed on a side of the first part 30A of the gate structure 30, and the second region R2 is disposed on a side of the second part 30B of the gate structure 30. More specifically, the first part 30A and the second part 30B of the gate structure 30 are two regions disposed in a horizontal first direction D1, directly contacting each other, and connected with each other. In this embodiment, a top surface of the first part 30A is on a level with a top surface of the second part 30B, and the top surface of the first part 30A is aligned with the top surface of the second part 30B; a bottom surface of the first part 30A is on a level with a bottom surface of the second part 30B, and the bottom surface of the first part 30A is aligned with the bottom surface of the second part 30B. The first region R1 and the second region R2 are disposed on two ends of the gate structure 30 in the first direction D1 respectively, the first region R1 is corresponding to a region for forming a source region subsequently, and the second region R2 is corresponding to a region for forming a drain region subsequently, but not limited thereto.

A patterned mask layer 40 is then formed on the semiconductor substrate 10 and the gate structure 30. The patterned mask layer 40 in this embodiment may include photoresist, insulation materials, or other appropriate mask materials. The patterned mask layer 40 covers the first region R1 of the semiconductor substrate 10 and the first part 30A of the gate structure 30. The second part 30B of the gate structure 30 and the second region R2 of the semiconductor substrate 10 are uncovered by the patterned mask layer 40. In other words, the patterned mask layer 40 in this embodiment does not cover the second part 30B of the gate structure 30 and the second region R2 of the semiconductor substrate 10, but the present invention is not limited to this. An implantation process 91 is then performed to form a drift region 11 in the second region R2. The drift region 11 may be formed in a self-aligned configuration at a side of the second part 30B of the gate structure 30 because the patterned mask layer 40 does not cover the second part 30B of the gate structure 30 adjacent to the second region R2 in the implantation process 91. In this embodiment, the semiconductor substrate 10 may have a first conductivity type or include a first conductivity type region preferably, the drift region 11 has a second conductivity type preferably, and the first conductivity type is complementary to the second conductivity type. For example, in this embodiment, the first conductivity type may be P-type and the second conductivity type may be N-type, but not limited thereto. In other words, the semiconductor substrate 10 may be a P-type semiconductor substrate or a semiconductor substrate including a P-type well, and the drift region 11 may be an N-type well, but not limited thereto. In addition, the implantation process 91 in this embodiment may be an tilted implantation process with a specific tilt angle preferably, so as to forming the drift region 11 partially overlapped by the gate structure 30 in a vertical second direction D2, but not limited thereto.

As shown in FIG. 1 and FIG. 2, the manufacturing method in this embodiment may further include removing the patterned mask layer 40 and forming a lightly doped region 12, a source region 13, a drain region 14, and a plurality of sidewall spacers SP, and a high-voltage metal-oxide-semiconductor (HV MOS) transistor device 100 as shown in FIG. 2 may be formed accordingly. The lightly doped region 12 and the source region 13 are formed in the first region R1, and the lightly doped region 12 is located between the source region 13 and the gate structure 30. The drain region 14 is formed in the drift region 11, and the sidewall spacers SP are formed on side surfaces of the gate structure 30. An edge of the source region 13 may be aligned with an edge of the sidewall spacer SP, and the drain region 14 may be defined by another patterned mask for keeping the drain region 14 relatively away from the corresponding sidewall spacer SP, but not limited thereto. In this embodiment, the source region 13 may be an N-type doped region, and the drain region 14 may be another N-type doped region preferably, when the semiconductor substrate 10 is a P-type semiconductor substrate or a semiconductor substrate including a P-type well, and the drift region 11 is an N-type well, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 3:
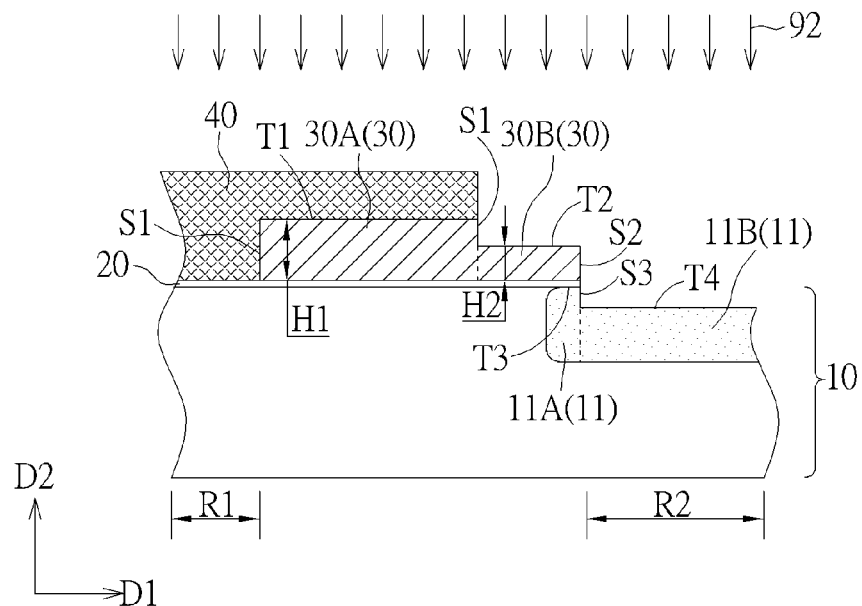
FIG. 3 and FIG. 4 are schematic drawings illustrating a manufacturing method of a high-voltage metal-oxide-semiconductor transistor device according to a second embodiment of the present invention.
Figure 4:
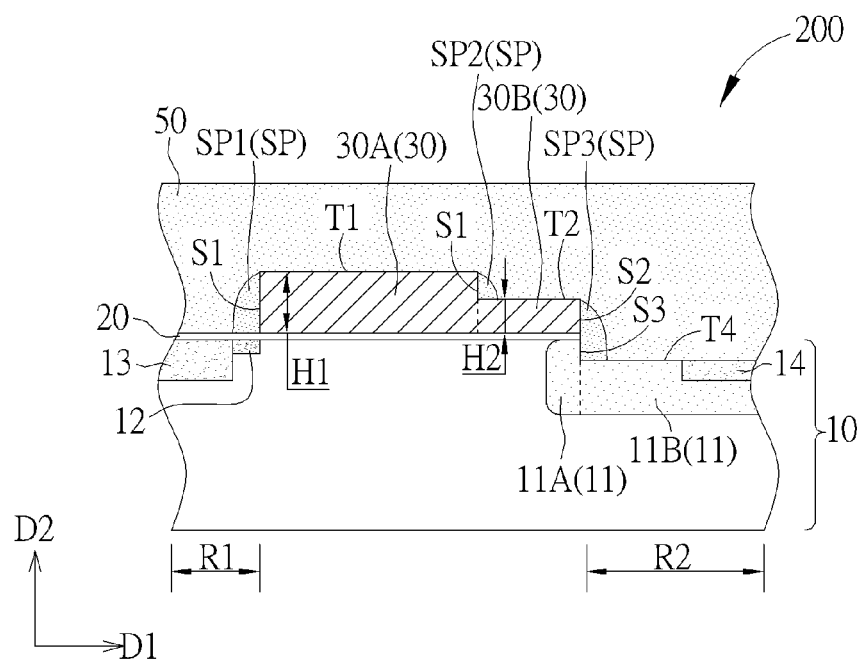

Please refer to FIG. 3, FIG. 4, and FIG. 1. FIG. 3 and FIG. 4 are schematic drawings illustrating a manufacturing method of a high-voltage metal-oxide-semiconductor transistor device according to a second embodiment of the present invention. As shown in FIG. 3 and FIG. 4, the differences between the manufacturing method of this embodiment and the manufacturing method of the first embodiment mentioned above is that the manufacturing method in this embodiment further includes performing an etching process 92 after the implantation process 91 shown in FIG. 1. The etching process 92 is performed to remove a part of the second part 30B of the gate structure 30 uncovered by the patterned mask layer 40. It is worth noting that the etching process 92 does not completely remove the second part 30B of the gate structure 30, and only a part of the second part 30B is etched away by the etching process 92 for reducing a thickness of the second part 30B. The first part 30A of the gate structure 30 is covered by the patterned mask layer 40 during the etching process 92 and will not be etched, and a thickness of the first part 30A of the gate structure 30 may remain unchanged accordingly. In other words, after the etching process 92, the thickness of the second part 30B is less than the thickness of the first part 30A, and a second top surface T2 of the second part 30B will be lower than a first top surface T1 of the first part 30A. Additionally, after the etching process 92, a first side surface S1 of the first part 30A of the gate structure 30 is directly connected with the second top surface T2 of the second part 30 B. Therefore, the first top surface T1, the first side surface S1, and the second top surface T2 are connected with one another for forming a ladder-shaped notch on a region of the gate structure 30 adjacent to the second region R2 and the drift region 11, and a fringing capacitance between the gate structure 30 and the drain region (not shown in FIG. 3) subsequently formed in the drift region 11 in the horizontal first direction D1 may be reduced accordingly.

In addition, as shown in FIG. 3, the patterned mask layer 40 in this embodiment does not cover the second region R2 of the semiconductor substrate 10 in the etching process 92, and a part of the drift region 11 is removed by the etching process 92. More specifically, in this embodiment, the process time of the etching process 92 may be controlled to stop the etching process while etching the gate structure 30 and the drift region 11. In other words, the etching depths of the gate structure 30 and the drift region 11 may be controlled so as to keep the gate structure 30 and the drift region 11 exposed in the etching process from being removed completely. In this embodiment, the etching depth of the gate structure 30 in the etching process 92 may be modified according to the thickness of the gate structure 30, and the variation range of the etching depth may be controlled for maintain the electrical characteristics of the transistor device subsequently formed and the uniformity thereof.

More specifically, the drift region 11 in this embodiment may include a third part 11A and a fourth part 11B connected with and contacting each other. The gate structure 30 overlaps the third part 11A of the drift region 11, and the fourth part 11B of the drift region 11 is uncovered by the gate structure 30. Therefore, after the etching process 92, a fourth top surface T4 of the fourth part 11B of the drift region 11 is lower than a third top surface T3 of the third part 11A, and a third side surface S3 of the third part 11A is connected to the fourth top surface T4 of the fourth part 11B. The etching process 92 in this embodiment is an anisotropic etching process preferably, so as to keep the third part 11A of the drift region 11 from being etched and ensure the electrical condition between the drift region 11 and the gate structure 30. Therefore, a second side surface S2 of the second part 30B of the gate structure 30 is substantially aligned with the third side surface S3 of the third part 11A of the drift region 11 preferably, but not limited thereto. The first top surface T1, the first side surface S1, the second top surface T2, the second side surface S2, the third side surface S3, and the fourth top surface T4 mentioned above may also form a ladder-shaped notch on the second region R2 and a side of the gate structure 30 adjacent to the second region R2. Additionally, the influence on the manufacturing cost may be avoided because the patterned mask layer 40 is also employed in the etching process 92 of this embodiment and no additional photolithographic process is required. It is worth noting that, in other embodiments of the present invention, the process parameters and the etching selectivity of the etching process 92 may be controlled to stop the etching action at the gate insulation layer 20 on the second region R2 without etching the second region R2 of the semiconductor substrate 10 when the patterned mask layer 40 does not cover the second region R2 of the semiconductor substrate 10.

As shown in FIG. 3 and FIG. 4, the manufacturing method of this embodiment may further include removing the patterned mask layer 40 and forming the lightly doped region 12, the source region 13, the drain region 14, and a plurality of the sidewall spacers SP, and a high-voltage metal-oxide-semiconductor (HV MOS) transistor device 200 as shown in FIG. 4 may be formed accordingly. The difference between this embodiment and the first embodiment mentioned above is that positions of the sidewall spacers SP will be different because a part of the gate structure 30 and a part of the drift region 11 are removed by the etching process in this embodiment. For example, the sidewall spacers SP in this embodiment may include a first sidewall spacer SP1, a second sidewall spacer SP2, and a third sidewall spacer SP3. The first sidewall spacer SP1 is formed on the side surface S1 of the first part 30A of the gate structure 30 adjacent to the first region R1. The second sidewall spacer SP2 is formed on another first side surface S1 of the first part 30A adjacent to the second region R2 and formed on the second top surface T2 of the second part 30B. The third sidewall spacer SP3 is formed on the second side surface S2 of the second part 30B, the third side surface S3 of the third part 11A of the drift region 11, and the fourth top surface T4 of the fourth part 11B of the drift region 11. Additionally, the manufacturing method of this embodiment may further include forming an interlayer dielectric 50 covering the gate structure 30, the drift region 11, the source region 13, and the drain region 14. A plurality of conductive plugs (not shown) may be formed in the interlayer dielectric 50 and connected to the gate structure 30, the source region 13, and the drain region 14 respectively, but not limited thereto.

As shown in FIG. 4, the HV MOS transistor device 200 includes the semiconductor substrate 10, the gate structure 30, and the drift region 11. The gate structure 30 is disposed on the semiconductor substrate 10. The gate structure 30 includes the first part 30A and the second part 30B. The thickness of the second part 30B is less than the thickness of the first part 30A. The drift region 11 is disposed on a side of the second part 30B of the gate structure 30. The first top surface T1 of the first part 30A of the gate structure 30 and the second top surface T2 of the second part 30B of the gate structure 30 are not coplanar. Additionally, the HV MOS transistor device 200 further includes the source region 13 and the drain region 14. The source region 13 and the drain region 14 are disposed in the semiconductor substrate 10 respectively. The source region 13 is disposed on a side adjacent to the first part 30A of the gate structure 30, and at least a part of the drain region 14 is disposed in the drift region 11. In addition, the HV MOS transistor device 200 further includes a plurality of the sidewall spacers SP disposed on the first side surface S1 of the first part 30A of the gate structure 30 and the second side surface S2 of the second part 30B. One of the sidewall spacers SP, such as the third sidewall spacer SP3, is disposed on the third side surface S3 of the third part 11A of the drift region 11 and the second side surface S2 of the second part 30B of the gate structure 30.

In this embodiment, a top surface of the source region 13 and a top surface of the drain region 14 are not coplanar, but not limited thereto. The second part 30B of the gate structure 30 and the fourth part 11B of the drift region 11 are partially etched, and the ladder-shaped notch is formed in the second region R2 and the region of the gate structure 30 adjacent to the second region R2. The fringing capacitance between the gate structure 30 and the drain region 14 in the horizontal first direction D1 may be reduced accordingly, and the gate-to-drain parasitic capacitance in the HV MOS transistor device 200 may be reduced. For example, compared to the HV MOS transistor device 100 in the first embodiment mentioned above, when the etching depth of the second part 30B of the gate structure 30 is around 0.1 micrometer in this embodiment, the cut-off frequency of the HV MOS transistor device 200 may be comparable to the HV MOS transistor device 100, the gate-to-drain parasitic capacitance (Cgd) may be reduced to about 75% of the Cgd of the HV MOS transistor device 100, and the break down voltage may be enhanced at the same time. The doping concentration of the drift region 11 may be further modified for obtaining more balanced results between the Cgd reduction and other electrical characteristics, such as the break down voltage and the cut-off frequency. Additionally, the etching depth of the second part 30B of the gate structure 30 is controlled in a range between 92% of the target depth and 108% of the target depth because the etching depth of the second part 30B of the gate structure 30 will influence the electrical properties of the HV MOS transistor device 200. Preferably, the etching depth of the second part 30B of the gate structure 30 is controlled in a range between 97% of the target depth and 103% of the target depth so as to ensure the HV MOS transistor device 200 presenting required electrical properties and uniformity.

Figure 5:
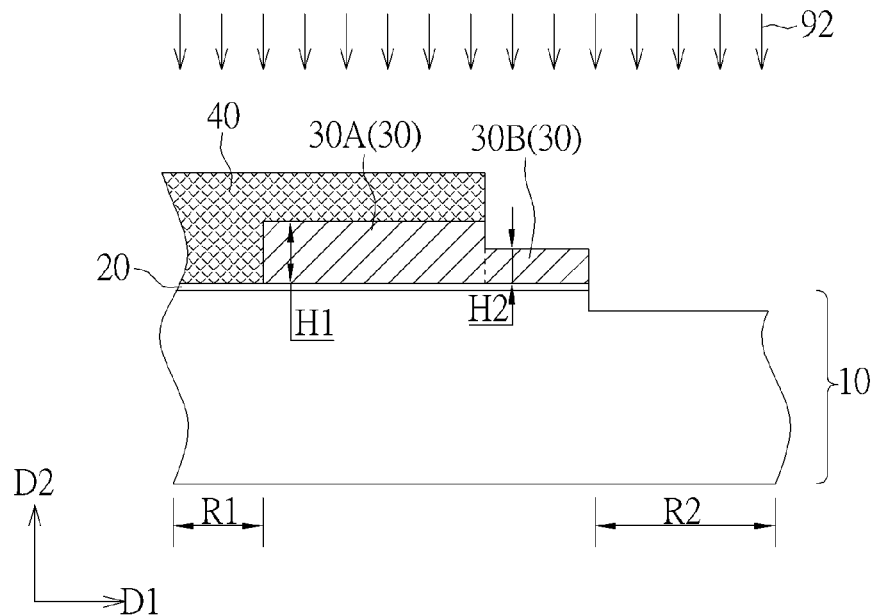
FIG. 5 and FIG. 6 are schematic drawings illustrating a manufacturing method of a high-voltage metal-oxide-semiconductor transistor device according to a third embodiment of the present invention.
Figure 6:
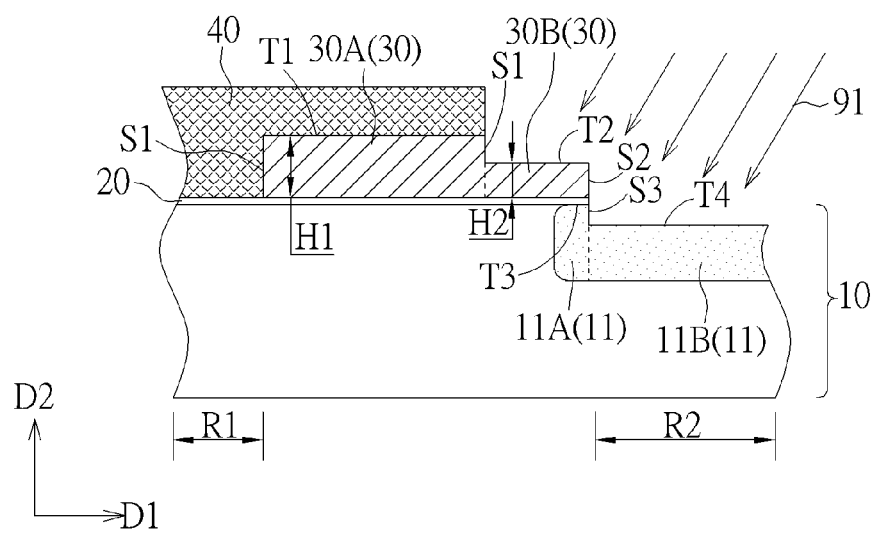

Please refer to FIG. 5 and FIG. 6. FIG. 5 and FIG. 6 are schematic drawings illustrating a manufacturing method of a high-voltage metal-oxide-semiconductor transistor device according to a third embodiment of the present invention. As shown in FIG. 5 and FIG. 6, the difference between this embodiment and the second embodiment mentioned above is that, in the manufacturing method of this embodiment, the implantation process 91 is performed after the etching process 92, and a part of the second region R2 of the semiconductor substrate 10 is removed by the etching process 92 before the implantation process 91. In this way, the fourth top surface T4 of the fourth part 11B of the drift region 11 formed after the implantation process 91 will not be influenced by the etching process 92, and that is advantageous to control the electrical properties of the HV MOS transistor device.

Figure 7:
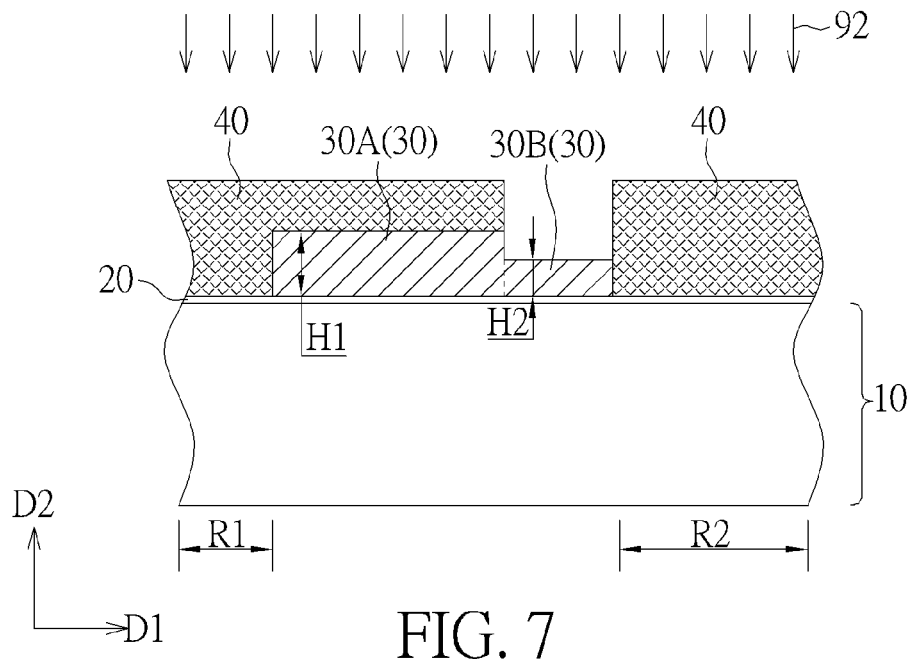
FIG. 7 and FIG. 8 are schematic drawings illustrating a manufacturing method of a high-voltage metal-oxide-semiconductor transistor device according to a fourth embodiment of the present invention.
Figure 8:
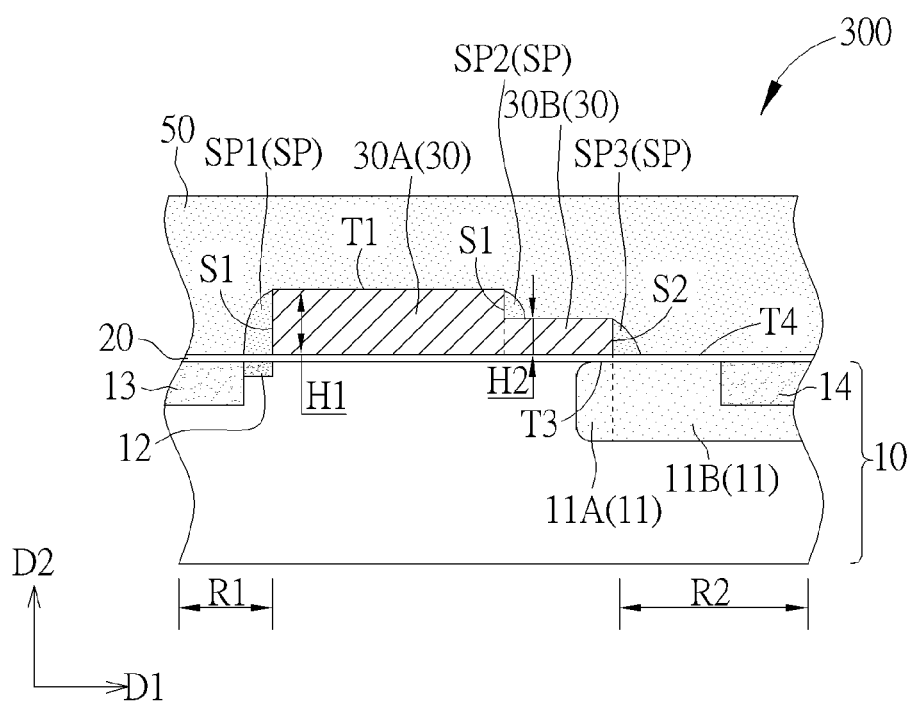

Please refer to FIG. 7 and FIG. 8. FIG. 7 and FIG. 8 are schematic drawings illustrating a manufacturing method of a high-voltage metal-oxide-semiconductor transistor device 300 according to a fourth embodiment of the present invention. As shown in FIG. 7 and FIG. 8, the difference between this embodiment and the second embodiment mentioned above is that the patterned mask layer 40 further covers the second region R2 of the semiconductor substrate 10 in the etching process 92 of this embodiment. The drift region 11 of the HV MOS transistor device 300 will not be etched by the etching process 92 no matter whether the implantation process mentioned above is performed before or after the etching process 92. In other words, in this embodiment, the third top surface T3 of the third part 11A of the drift region 11 and the fourth top surface T4 of the fourth region 11B may be coplanar. Compared to the HV MOS transistor device 200 in the second embodiment mentioned above, the reduced amount of the Cgd in the HV MOS transistor device 300 of this embodiment is smaller, but other electrical properties such as the break down voltage and the cut-off frequency will be comparable. It is worth noting that, in other embodiments of the present invention, the patterned mask layer 40 may not cover the second region R2 of the semiconductor substrate 10, and the process parameters and the etching selectivity of the etching process 92 may be controlled to stop the etching action at the gate insulation layer 20 on the second region R2 without etching the second region R2 of the semiconductor substrate 10.

To summarize the above descriptions, according to the manufacturing method of the HV MOS transistor device in the present invention, a part of the gate structure is removed by the etching process, the portion of the gate structure adjacent to the drift region may become relatively thinner, and the gate-to-drain parasitic capacitance may be reduced nearly without influencing other device characteristics of the transistor device accordingly. When the HV MOS transistor device of the present invention is used as a power amplifier, the power added efficiency (PAE) will be enhanced by the reduced gate-to-drain parasitic capacitance (Cgd) accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage metal-oxide-semiconductor (HV MOS) transistor device, comprising:
   a semiconductor substrate;
   a gate structure disposed on the semiconductor substrate, wherein the gate structure comprises a first part and a second part, and a thickness of the second part is less than a thickness of the first part, a top surface of the first part of the gate structure and a top surface of the second part of the gate structure are not coplanar, and a bottom surface of the first part of the gate structure and a bottom surface of the second part of the gate structure are substantially coplanar, wherein the top surface of the second part is lower than the top surface of the first part; and
   a drift region disposed on a side of the second part of the gate structure.

2. The HV MOS transistor device of claim 1, further comprising:
   a source region disposed in the semiconductor substrate; and
   a drain region disposed in the semiconductor substrate, wherein at least a part of the drain region is disposed in the drift region, and the source region is disposed on a side adjacent to the first part of the gate structure.

3. The HV MOS transistor device of claim 2, wherein a top surface of the source region and a top surface of the drain region are not coplanar.

4. The HV MOS transistor device of claim 2, wherein the source region comprises an N-type doped region, the drain region comprises an N-type doped region, and the drift region comprises an N-type well.

5. The HV MOS transistor device of claim 1, wherein the first part of the gate structure is connected to and contacts the second part of the gate structure, and a side surface of the first part is connected to a top surface of the second part.

6. The HV MOS transistor device of claim 5, further comprising a plurality of sidewall spacers disposed on the side surface of the first part and a side surface of the second part.

7. The HV MOS transistor device of claim 1, wherein the drift region comprises a third part and a fourth part connected with each other, the gate structure overlaps the third part of the drift region, and the fourth part of the drift region is uncovered by the gate structure.

8. The HV MOS transistor device of claim 7, wherein a top surface of the fourth part is lower than a top surface of the third part, and a side surface of the third part is connected to the top surface of the fourth part.

9. The HV MOS transistor device of claim 8, further comprising a sidewall spacer disposed on the side surface of the third part of the drift region and a side surface of the second part of the gate structure.

* * * * *